(12) United States Patent
McCrea et al.

(10) Patent No.: US 7,126,724 B2
(45) Date of Patent: Oct. 24, 2006

(54) FLEXOGRAPHIC PRINTING

(75) Inventors: Devon James McCrea, Burnaby (CA); Stephen Hughes Miller, Silver Spring, MD (US)

(73) Assignee: Kodak Graphic Communications Canada Company, British Columbia (CA)

( * ) Notice: Subject to any disclaimer, the term of this patent is extended or adjusted under 35 U.S.C. 154(b) by 0 days.

(21) Appl. No.: 10/736,216

(22) Filed: Dec. 15, 2003

(65) Prior Publication Data

US 2004/0177782 A1 Sep. 16, 2004

Related U.S. Application Data

(60) Provisional application No. 60/453,544, filed on Mar. 12, 2003.

(30) Foreign Application Priority Data

Mar. 11, 2003 (CA) ..................................... 2422132

(51) Int. Cl.
*H04N 1/405* (2006.01)
*G03F 7/004* (2006.01)

(52) U.S. Cl. ........................ 358/3.3; 358/1.9; 358/3.06; 358/3.09; 101/395; 101/401; 101/401.1; 430/306

(58) Field of Classification Search ................. 101/395, 101/401, 401.1; 430/306; 358/1.9, 3.06, 358/3.09, 3.13, 3.14, 3.3, 3.2
See application file for complete search history.

(56) References Cited

U.S. PATENT DOCUMENTS

| | | | |
|---|---|---|---|
| 4,101,324 A | 7/1978 | Mizuno et al. | |
| 4,610,950 A | 9/1986 | Milliken | |
| 4,927,723 A | 5/1990 | Cusdin | |
| 5,813,342 A | 9/1998 | Strong | |
| 6,406,833 B1 | 6/2002 | Nouel | |
| 6,515,768 B1* | 2/2003 | Deschuytere et al. | 358/3.06 |
| 2002/0083855 A1 | 7/2002 | Samworth | |
| 2003/0043414 A1* | 3/2003 | Brady | 358/3.06 |
| 2003/0048477 A1* | 3/2003 | Russell | 358/3.06 |
| 2003/0084803 A1 | 5/2003 | Gross | |
| 2004/0130753 A1 | 7/2004 | Crounse | |

FOREIGN PATENT DOCUMENTS

WO   WO 02/085625 A1   10/2002

\* cited by examiner

*Primary Examiner*—Andrew H. Hirshfeld
*Assistant Examiner*—Joshua Zimmerman

(57) ABSTRACT

A method of screening a continuous tone image into a halftone representation for a flexographic printing operation can compensate for characteristic printing problems in highlight areas by selectively placing non-printing dots proximate highlight dots. The non-printing dots raise the printing relief floor in the highlight areas providing additional support for marginally printable image features.

19 Claims, 7 Drawing Sheets

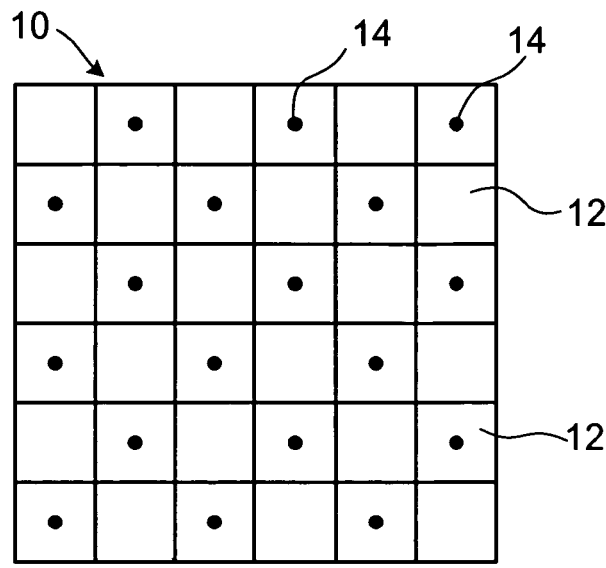
FIG. 1-A
Prior Art
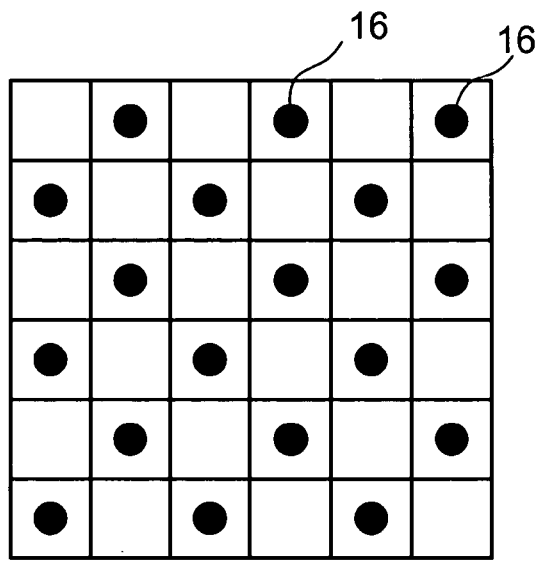
FIG. 1-B
Prior Art
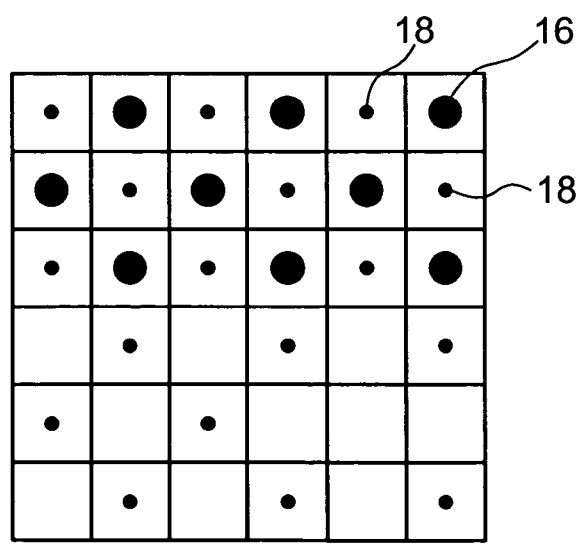
FIG. 1-C
Prior Art

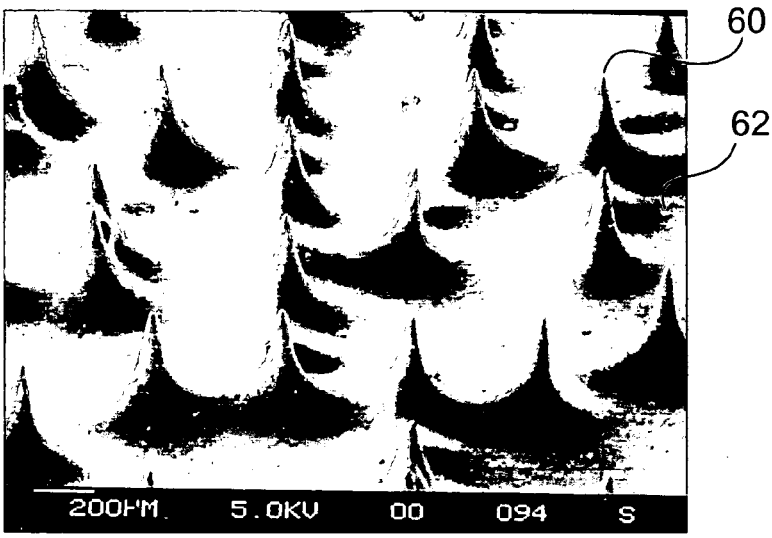
FIG. 6-A
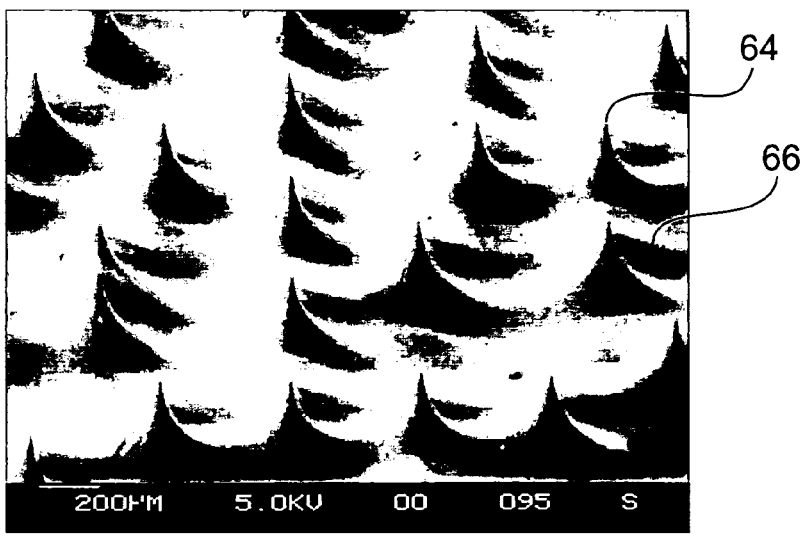
FIG. 6-B
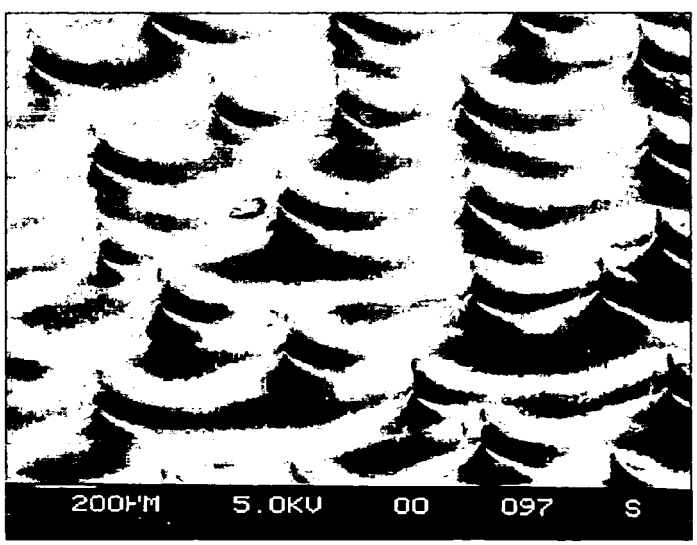
FIG. 6-C

FLEXOGRAPHIC PRINTING

RELATED APPLICATIONS

This application claims the benefit of U.S. Provisional Application No. 60/453,544, filed Mar. 12, 2003, and claims priority to Canadian Application No. 2,422,132, filed Mar. 11, 2003. Both of these applications are herein incorporated by reference.

TECHNICAL FIELD

The invention relates to the field of flexographic printing and more particularly to screening methods for representing an image on a flexographic plate.

BACKGROUND

Flexographic printing is a method of direct rotary printing that uses a resilient relief image in a plate of rubber or photopolymer to print articles such as cartons, bags, labels or books. Flexographic printing has found particular application in packaging, where it has displaced rotogravure and offset lithography printing techniques in many cases. While the quality of articles printed using flexographic plates has improved significantly as the technology has matured, physical limitations related to the process of creating a relief image in a plate remain.

In particular, it is very difficult to print small graphic elements such as fine dots, lines and even text using flexographic printing plates. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both the aforementioned cases, it is necessary to print very small dot sizes to adequately represent the highlight areas.

Maintaining small dots on a flexographic plate is very difficult due to the nature of the plate making process. Digital flexographic plate precursors have an integral UV-opaque mask layer coated over the photopolymer. In a pre-imaging (or post-imaging) step the floor of the plate is set by area exposure to UV light from the back of the plate. This exposure hardens the photopolymer to the relief depth required for optimal printing. This step is followed by selective ablation of the mask layer with an imagewise addressable high power laser to form an image mask that is opaque to ultraviolet (UV) light in non-ablated areas. Flood exposure to image-forming UV radiation and chemical processing follow wherein the areas not exposed to UV are removed in a processing apparatus using solvents or by a heating and wicking process. The combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Conventional or non-digital flexographic platemaking follows a similar process except that the integral mask is replaced by a separate film mask or phototool that is imaged separately and placed in contact with the photopolymer plate precursor under a vacuum frame for the image-forming UV exposure.

In printing, it is well known that there is a limit to the minimum size of halftone dot that may be reliably represented on a plate and subsequently printed on press. The actual minimum size will vary with a variety of factors including plate type, ink, imaging device characteristics etc. This creates a problem in the highlight areas when using conventional AM screening since once the minimum dot size is reached, further size reductions will generally have unpredictable results. If, for example, the minimum size dot that can be printed is a 50×50 µm square dot, corresponding to a 5% tone at 114 lines per inch screen frequency, then it becomes very difficult to faithfully reproduce tones between 0% and 5%. A common workaround is to increase the highlight values in the original file to ensure that after imaging and processing, that all the dots on the plate are properly formed. However, the downside to this practice is the additional dot gain in the highlights, which causes a noticeable transition between inked and non-inked areas. Another well-known practical way of improving highlights is through the use of "Respi" or "double dot" screening. One such technique is shown in FIGS. 1-A to 1-C. A screening grid 10 for conventional AM screen is shown in a simplified schematic format. The screening grid comprises a plurality of halftone cells 12. A halftone cell is an area wherein an AM halftone dot is grown from a low density, where only a small dot is placed at the centre of the cell, to a high density or solid where the cell is completely filled. In FIG. 1-A, dots 14 are placed only in every second halftone cell. Dots 14 have size corresponding to the minimum reliably reproducible dot. As the density of the screen is increased, dots 14 are increased in size as shown in FIG. 1-B at 16. At some point in increasing the density, the previously empty halftone cells are populated with minimum size dots 18 as shown in FIG. 1-C. The dots 16 may be held at a fixed size with increasing screen density while allowing dots 18 to grow. When all dots are the same size as dots 16, conventional AM screening takes over.

The problem with this type of screening technique when applied to flexographic printing is that the size of dot that may be printed in isolation is actually quite large, typically 40–50 µm in diameter. Even when using this technique, the highlights are difficult to reproduce without having a grainy appearance (which occurs when dots are spaced far apart to represent a very low density).

There remains a need to improve the representation of small dots in flexographic printing processes.

SUMMARY OF THE INVENTION

The invention provides a flexographic screening technique that allows an image feature to be surrounded by one or more smaller non-printing features to provide an extra base of support for the image feature.

In one general aspect, the invention features a method for preparing a halftone representation of an image for use in making a flexographic printing plate. This method includes identifying at least one printable image feature in the halftone representation to be used in making the flexographic plate according to at least one predetermined decision criterion, and establishing at least one non-printing image feature proximate to the identified printable image feature.

In preferred embodiments, the step of establishing can be operative to establish one or more non-printing dots as the non-printing image feature. The step of identifying can be operative to identify marginally printable image features that are too small to be reliably printed as the identified printable image features. The step of identifying can include establishing a minimum size of image feature that is reliably printable as the at least one decision criterion. The step of identifying can include locating in the halftone representation, image features that are smaller than the minimum size. The step of identifying can include locating in the image, image features that are smaller than the minimum size. The image feature can be a dot, with the minimum size corresponding to a minimum reliably printable dot area. The image feature can be a line, with the minimum size corresponding to a minimum reliably printable line thickness. The method can further include screening a continuous tone image to create the halftone representation. The step of establishing at least one non-printing image feature can include adding a non-printing dot to the halftone representation. The halftone representation can be an amplitude-modulated screen representation of the continuous tone image. The halftone representation can be a frequency-modulated screen representation of the continuous tone image. The step of screening can include comparing the image to a threshold array on a pixel-by-pixel basis. The method can further include exposing the flexographic printing plate to image-forming radiation in accordance with the halftone representation. The step of exposing the flexographic plate to image-forming radiation can include preparing a film mask in accordance with the halftone image representation, and exposing the flexographic printing plate to image-forming radiation through the film mask. The identifying step and the establishing step can be performed in a single operation. The method can further include removing sub-marginally printable image features from the halftone image representation. The step of establishing can be operative to establish non-printing dots as the non-printing image features, with the non-printing dots being no larger in area than 2500 µm2.

In another general aspect, the invention features a method for preparing a flexographic printing plate, which includes establishing a relief floor by back-exposing the flexographic printing plate and receiving halftone image data representing an image to be printed. The halftone image data defines a plurality of printable image features, at least one non-printing area proximate at least, one of the printable image features, and at least one non ink-accepting background area. The flexographic printing plate is exposed in accordance with the halftone image data, and processed to develop a relief image.

In a further general aspect, the invention features a flexographic printing plate that includes a non ink-accepting background area and an ink-accepting surface defined in relief to the background area and formed in accordance with an image to be printed. The ink-accepting surface has printable image features, and at least one non-printing feature is disposed proximate to at least one of the printable image features. In preferred embodiments, the non-printing features can include a plurality of non-printing dots disposed around a periphery of at least one marginally printable image feature.

In another general aspect, the invention features an apparatus for preparing an image for use in making a flexographic printing plate. This apparatus includes a workstation for receiving image data representing an image, a raster image processor for converting the image into a halftone representation thereof, and an image processor for identifying at least one printable image feature and establishing at least one non-printing image feature in proximity to the printable image feature. In preferred embodiments, the image processor can have a memory for storing the halftone representation once the non-printing image features have been established.

In another general aspect, the invention features an apparatus for preparing an image for use in making a flexographic printing plate, which includes printable image feature identification logic operative to identify at least one printable image feature in a halftone representation to be used in making a flexographic plate according to at least one predetermined decision criterion, and non-printing image feature establishment logic responsive to the printable image feature identification logic and operative to establish at least one non-printing feature proximate to the printable image feature identified by the printable image feature identification logic.

In a further general aspect, the invention features an apparatus for preparing an image for use in making a flexographic printing plate, which includes means for identifying at least one printable image feature in a halftone representation to be used in making a flexographic plate according to at least one predetermined decision criterion, and means responsive to the printable image feature identification logic for establishing at least one non-printing feature proximate to the printable image feature identified by the means for identifying.

In another general aspect, the invention features a memory for storing data for access by a flexographic printing system, with the memory including machine-readable data elements adapted to specify to the flexographic printing system at least one printable image feature, at least one non-printing feature proximate the printable image feature, and at least one non ink-accepting background area. In preferred embodiments, the machine-readable data elements can include data elements operative to specify the non-printing feature as one or more non-printing dots.

For an understanding of the invention, reference will now be made by way of example to a following detailed description in conjunction by accompanying drawings.

BRIEF DESCRIPTION OF THE DRAWINGS

In drawings which illustrate by way of example only preferred embodiments of the invention:

FIGS. 1-A–1-C are schematic diagrams of a prior art screening method;

FIG. 6-A–6-C are a series of photographs of flexographic plate samples taken of plates prepared with and without the use of the methods of the present invention.

DESCRIPTION

Figure 2:
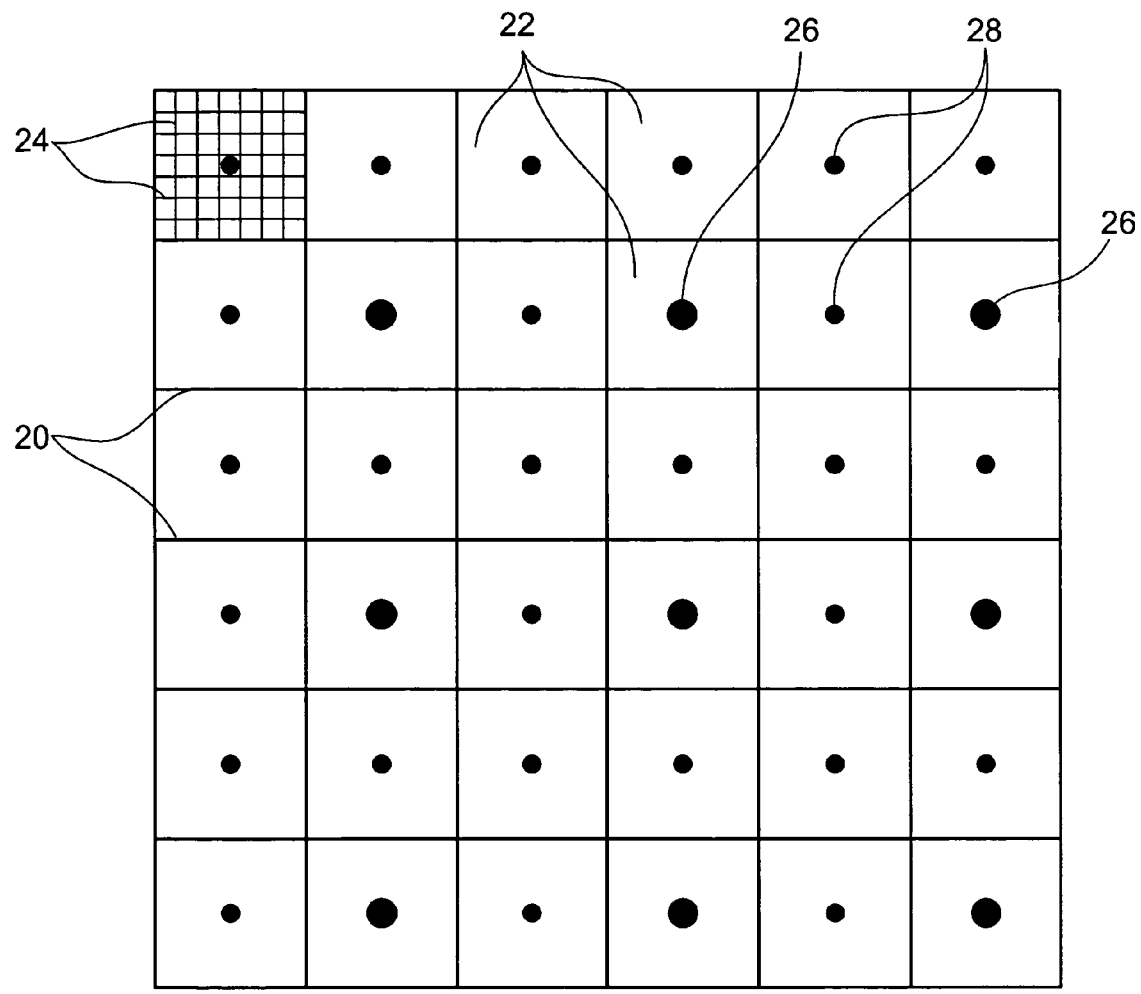
FIG. 2 is a schematic diagram of an embodiment of a screening method in accordance with the present invention.

An embodiment of the invention is shown in FIG. 2. Lines 20 demarcate a plurality of halftone cells 22. It will be readily appreciated that each cell has a plurality of possible locations where the imaging device may place a picture element (pixel) to make up a halftone dot. These locations are shown as grid lines 24 in the upper left hand corner of FIG. 1 (these locations are omitted in the rest of FIG. 2 for sake of clarity). The pixel size is commonly a function of the imaging device configuration and may be fixed or variable. The halftone cell size is a function of the screening engine and is chosen to suit a particular screening job or a category of screening jobs.

A plurality of small halftone dots 26 representing a low density tone or highlight which it is desired to print in the final product are placed at the centres of halftone cells 22. In this case, only one quarter of the halftone cells have printing dots 26. Halftone dots 26 generally comprise a plurality of pixels. While dot 26 is shown having circular shape, in practice the shape will depend on the shape of the pixels and how many pixels are used to make up the dot and the particular spot function chosen. Dot 26 could therefore be irregularly shaped or even square. The size of Dot 26 is such that it may not print without the aforementioned problems. In other words, dot 26 is a marginally printable feature, which may or may not print properly in a subsequent printing operation. The minimum marginally printable dot size may be determined by the printer from knowledge of a particular printing process.

Dots 26 each have neighbouring halftone dots 28 which are specifically sized to be non-printing i.e. when the plate is processed dots 28 are small enough that they will be at least partially removed by the processing solvents. Non-printing dots 28 are spaced apart from the dots 26 by an amount sufficient to ensure that dots 28 and 26 do not join. Consequently, dots 28 after processing do not present a relief area that will take up ink and print. Surprisingly, it was found that non-printing dots 28 surrounding printing dots 26, provides an extra base of support for the dot 26 that appears to prevent the dots 26 from being removed by processing. Furthermore, dots 26 were also prevented from breaking off during printing operations. Through the inclusion of non-printing dots 28 the printer could reliably hold smaller dot sizes on press than was previously possible. An added advantage is that since the dots do not print, but only contribute to the base of the relief, they do not change the printed density of the particular tone that it is desired to represent.

Figure 3:
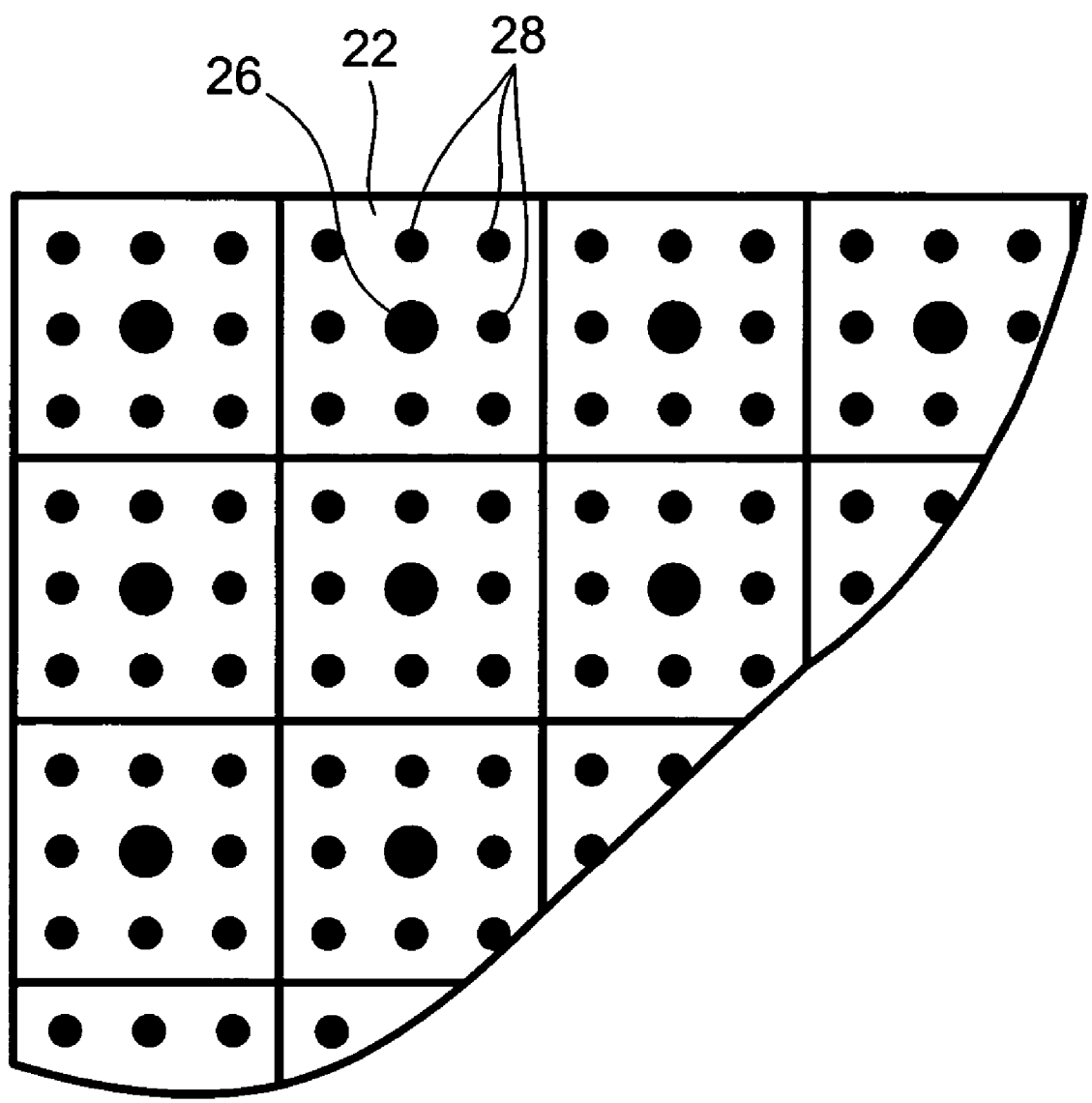
FIG. 3 is a schematic diagram of another embodiment of a screening method in accordance with the present invention.

In another embodiment of the invention, the supporting dots need not necessarily be in adjacent halftone cells. FIG. 3 shows a portion of the screen from FIG. 2 where there are printing halftone dots 26 in every halftone cell and the non-printing halftone dots 28 form a periphery around dots 26 within the same halftone cell.

Figure 4:
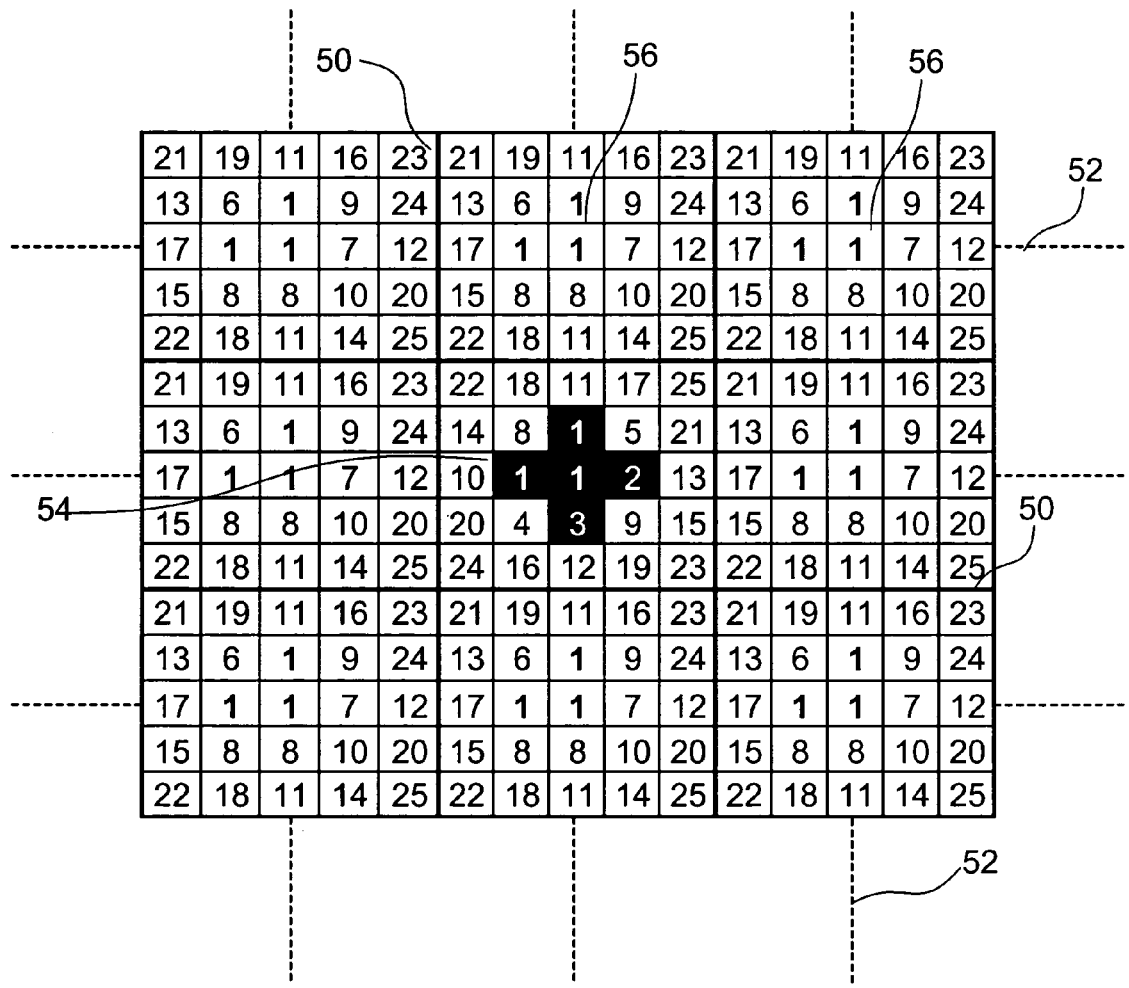
FIG. 4 is a schematic diagram of a threshold array based screening method.

There are several practical screening methods for placing non-printing dots. A preferred embodiment, that is also simple, involves using threshold-array-based AM screening wherein a few central pixels of every halftone dot on the halftone grid are always turned on. The threshold array is compared with the contone image on a pixel-by-pixel basis to build the halftone representation of the contone image. FIG. 4 shows a plurality of halftone dot cells established as indicated by the darkened outlines 50. Each cell has a plurality of locations, in this case 25 locations. The halftone cells are commonly centered on what is known as the screen grid shown as dotted lines 52. The screen grid shown has a screen angle of 0° but it should be understood that the screen grid may also be rotated by some angle to form the screen at commonly used screen angles as is well known in the art. In such a case the halftone cells may not be rectangular in shape but will be defined within the confines of the underlying imaging engine resolution grid. In operation, the threshold matrix as shown is tiled across the plane of the image to cover the entire area thereof. Threshold array screening is well known in the art.

The values at each location determine whether a particular pixel will be on or off, depending on the density of the continuous tone (contone) image at that point. In FIG. 4 the contone image density for the situation and area shown is 3 units (assuming the continuous tone is broken up into 25 levels). Locations in the threshold matrix that have levels less than and equal to 3 will be on. Dot 54 is shown shaded black to indicate that it is on, as it comprises values between 1 and 3. In cells adjacent to the cell containing dot 54, non-printing dots 56 are formed. These dots are below the determined marginally printable dot threshold while dot 54 is on or above that threshold. As the tone density is increased dots 54 will increase in size and dots 56 may also be encompassed in other printing dots in these other regions. Eventually all non-printing dots are obscured by printing dots; the non-printing dots being mainly of use in highlight areas. Once the non-printing dots have disappeared, the screening method returns to conventional AM screening.

The inclusion of non-printing dots has the effect of selectively altering the relief depth in only the areas where such a change is necessary to support marginally printable dots or features. Advantageously areas where the halftone dot size is large enough to print without problem are unaffected.

In an another embodiment, threshold array based FM screening may be adapted to include the non-printing dots. An intermediate tone level is chosen in the FM screen where clusters of dots have formed and the clusters are in close proximity to one another. A non-printing dot is placed at the centre of the cluster. The tone level is chosen having regard to the development of random or pseudo-random dots into clusters of dots according to the particular FM screening technique in use. For example, a 30% tone might be convenient since clusters will generally have formed at this stage. This serves to centre a substantial number of the non-printing dots in the clusters so that as the tone density increases the non-printing dots are mostly overwritten by printing dots, thus rendering them redundant as the density increases.

In another embodiment where it is desired to have more control over the non-printing dots, threshold array screening may be found limiting since it is technically only possible to have the non-printing dot always on, even if they do eventually become encompassed by printing dots. For the situation depicted in FIG. 3 there is no particular problem having all dots 28 on while dot 26 is still small. However, as the tonal density is increased and dot 26 is grown to fill more of the area of halftone cell 22, dot 26 will eventually join with dots 28. When joined to a larger area dot, dots 28 will add to the printing area thus causing undesirable tonal discontinuities. Preferably, dots 28 should be switched off before reaching this point, or as soon as dots 26 no longer need support. Such control over the dots 28 is not easily achievable using threshold arrays but other known screening methods may be employed.

Figure 5:
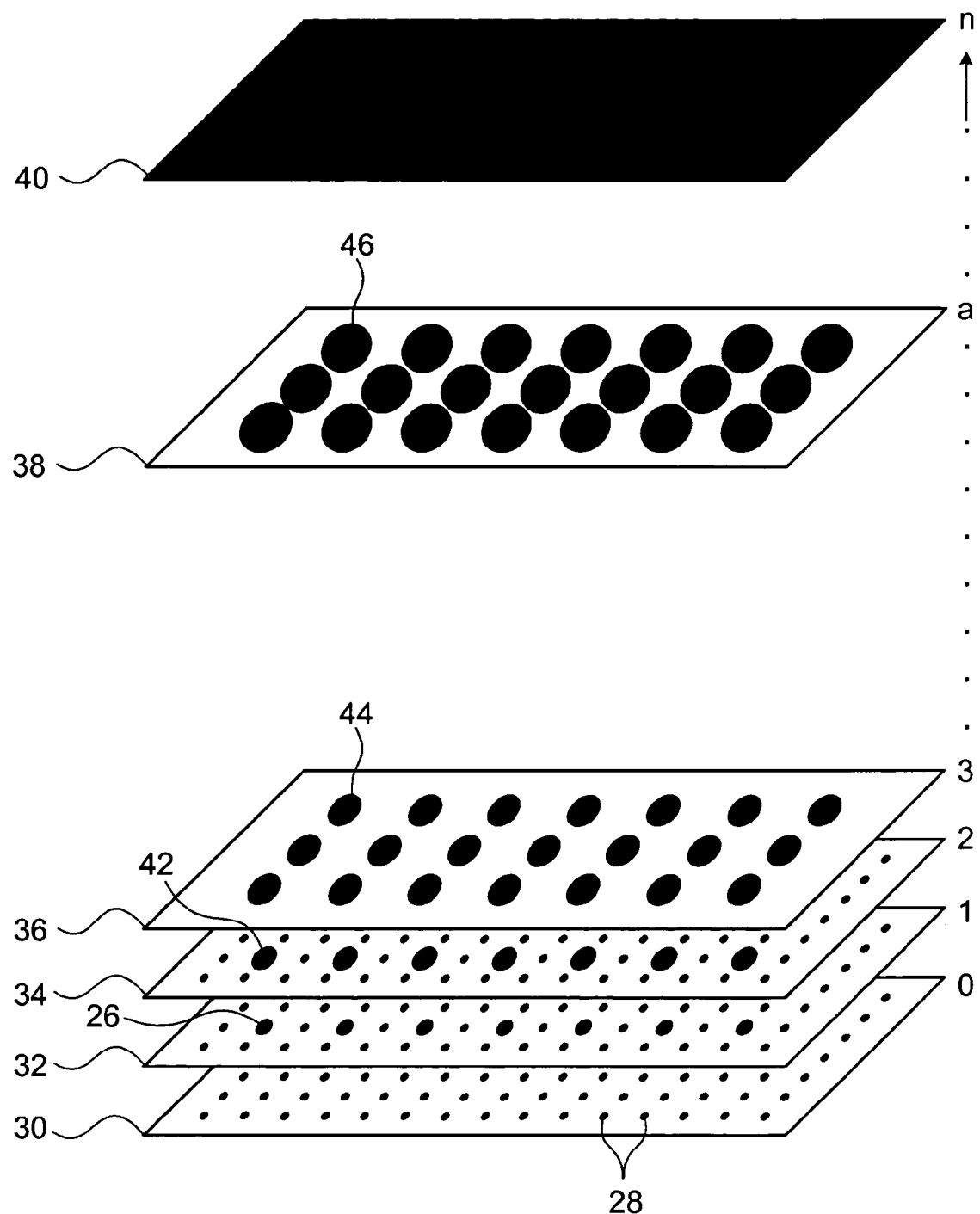
FIG. 5 is a schematic diagram of a tile-based screening method.

One particular method is shown in FIG. 5. A series of tiles 30–36 contain monotonically increasing density screens. Tile 38 is at some intermediate density and tile 40 is a solid.

There are n tiles in all corresponding to the desired number of tone levels in the image. It should be appreciated that the tiles in FIG. 5 are not physical objects, but rather manifestations of data structures in a computer device. For example, the set of tiles may be a 3 dimensional array of values, each individual tile being represented as a two dimensional array in the three dimensional array, there being n such individual tiles in the array. The screening of an image from a contone representation into a halftone representation, involves, for each pixel of the contone image, determining the tone of the pixel and looking up the corresponding tile and applying that tile to the image pixel to achieve the halftone representation.

Tile 30 is the tile that will be used where no-density (0% tone) is desired. This tile has non-printing dots 28 dispersed over the surface. At this tone level, none of the dots 28 will print on the final article. Tile 32 shows the lowest density step where a plurality of small dots 26 have been placed, each being peripherally surrounded by non-printing dots 28. In tile 34, the dot 42 is the dot 26 from tile 32 that has now been increased in size. Note though that dot 42 is still surrounded by, but not touching non-printing dots 28. In tile 36 dots 44 are again increased in size but now non-printing dots are removed. Dot 44 is large enough not to need support from the non-printing dots—this is now conventional AM screening. An intermediate tile 38 shows dots 46. If dots 28 were still on at this stage, they would be adding to the size of dots 46 causing undesirable increases or jumps in tone level. The final tile 48 is a solid tile wherein all dots have grown into each other to completely cover the area of the tile.

While the embodiment in FIG. 5 has been described in relation to AM screening, it is also adaptable to FM screening wherein each tile has a density represented by an FM screening technique and the non-printing dots are placed in close proximity to (but not adjacent to) small clusters of pixels in the FM screen that are desired to be printed. The size, number, and placement of these non-printing dots are allowed to vary for each tile (i.e. may not place any non-printing dots once all of the clusters in the FM screen have reached a sufficient size). This method has an advantage over the threshold array based approach in that the non-printing dots can be placed closer to the clusters (thus providing more support) while avoiding the potential tone jump caused by printing dots joining with non-printing dots. The advantage of using a tiled screen representation is that the non-printing dots can be confined to a few lower density tiles. This allows the highlights to be treated in isolation without affecting the intermediate and high-density tones. In contrast, when using a threshold matrix, it is generally speaking, an all or noting proposition.

In yet another embodiment of the invention the image may be conventionally screened without placing any non-printing dots. The screened image is then post processed to add a supporting infrastructure of non-printing halftone dots, in close proximity to any small halftone dots that meet some pre-determined criteria of needing support of non-printing dots. Likewise, the post processing may also identify thin lines or other delicate structure defining marginally printable features that may not print properly. A support infrastructure may be placed around the periphery of lines and other small features in the same way as for dots.

Similarly sub-marginally printable dots may be also be removed from the screened image. By "sub-marginally printable dot" is meant a dot that is smaller than the minimum dot size that is reliably printable even with a supporting infrastructure of non-printing dots. These sub-marginal dots, even with a supporting infrastructure may be susceptible to the problems previously described. It may be advantageous to remove these sub-marginal dots from the image after screening. As an example consider a situation where it is determined that dots of diameter smaller than 50 μm are marginally printable but that dots smaller than 30 μm will still be marginally printable even with the support of non-printing dots. Placing non-printing 20 μm diameter dots around the 30 μm dot may not be sufficient to guarantee that the 30 μm dot will print reliably. In this situation, a step may be added to the process whereby all dots smaller than 30 μm are completely removed form the image. Dots of between 30 and 50 μm diameter will be supported by 20 μm non-printing dots and will print reliably.

EXAMPLE

A test was run using the Creo ThermoFlex imaging engine sold by Creo Inc of Burnaby, BC, Canada to image a flexographic plate. The plate, once imaged was processed according to usual procedures. The plate contained highlight areas with and without the inclusion of non-printing dots. The photographs shown in FIG. 6-A to 6-C show areas of the plate after processing with a 1% screen @120 lpi. FIG. 6-A shows 1% dots without the support of non-printing dots. Dot 60 has steep shoulders and very little base support. The floor of the flexographic plate shown at 62 is set by a previous back exposure, the level of back exposure chosen for the best overall performance of the plate.

In FIG. 6-B a plurality of 4 pixel non-printing dots have been introduced in the background area of the 1% screen. The floor of the flexographic plate shown at 66 has been effectively raised by the inclusion of these non-printing dots. It should be noted that the shoulders of dot 64 are significantly widened by the inclusion of non-printing dots. It should also be immediately obvious that the inclusion of such dots will reduce the possibility of the small relief features breaking off or folding over. On the other hand, it should also be noted that relief dot 64 has not perceptibly increased in size at the printing relief plane.

In FIG. 6-C the non-printing dots have been increased in size to 6 pixels. The corresponding raising of the relief floor is clearly visible. The relief depth can be selectively varied by varying the size and/or number of non-printing dots.

Figure 7:
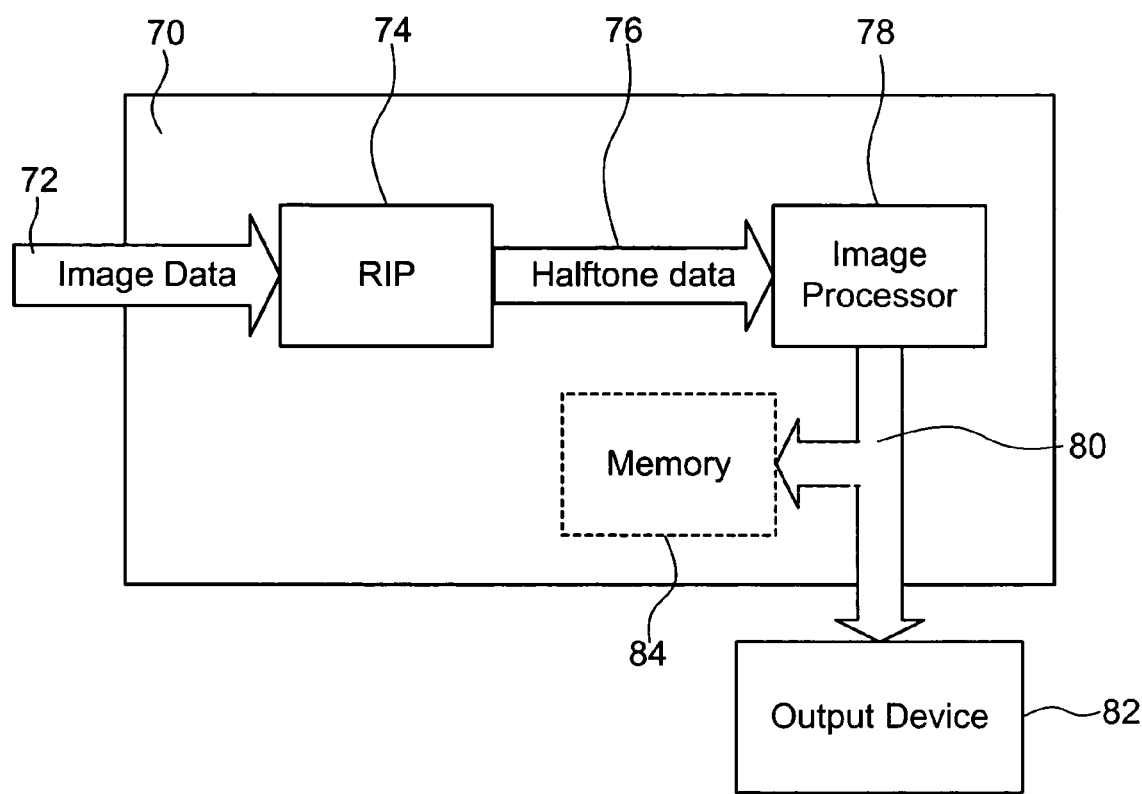
FIG. 7 is a schematic view of an apparatus for carrying out the methods of the present invention.

FIG. 7 shows an apparatus for providing a halftone representation of an image in accordance with the invention. A workstation 70 receives contone image data 72. The workstation may be a general-purpose programmable computer such as an INTEL® processor based PC running a MICROSOFT WINDOWS® operating system. The contone image data 72 is converted into a raster image by Raster Image Processor (RIP) 74. RIP 74 can employ a plug-in card implementing the rasterising functions in hardware, a stand-alone hardware device, and/or a software module that runs on a suitable general-purpose computer. RIP 74 converts the conrone image data 72 into halftone data 76. The halftone data 76 is passed on to an image processor 78. Again, image processor 78 may be implemented in software, hardware or a combination of both. It is well known to employ specialized image processing hardware to speed up image processing functions, but this may no longer be necessary with the advent of extremely fast and low priced general-purpose computers. Image processor 78 scans the halftone data 76 to identify marginally printable features and acids non-printing dots in proximity to the marginally printable features. The resulting halftone data 80 is sent to an output device 82 that prepares the flexographic printing plate in accordance with the halftone data 80. Image processor 78 may process the halftone data 78 on-the-fly, identifying marginally printable features and placing halftone dots while outputting the data 80 to output device 82. Alternatively, workstation 70 may incorporate or allocate memory 84 for storing halftone data 82 prior to outputting it to imaging device 82.

As will be apparent to those skilled in the art in the light of the foregoing disclosure, many alterations and modifications are possible in the practice of this invention without departing from the spirit or scope thereof.

What is claimed is:

1. A method for preparing a halftone representation of an image for use in making a flexographic printing plate, the method comprising:
    identifying at least one printable image feature in the halftone representation to be used in making the flexographic plate according to at least one predetermined decision criterion; and
    establishing at least one non-printing image feature proximate to the printable image feature identified in the step of identifying, wherein the step of establishing establishes the non-printing feature as including at least one pixel that is turned on.

2. The method of claim 1, further comprising screening a continuous tone image to create the halftone representation.

3. The method of claim 2, wherein the halftone representation is an amplitude-modulated screen representation of the continuous tone image.

4. The method of claim 2, wherein the halftone representation is a frequency-modulated screen representation of the continuous tone image.

5. The method of claim 2, wherein the step of screening comprises comparing the image to a threshold array on a pixel-by-pixel basis.

6. The method of claim 1, wherein the identifying step and the establishing step are performed in a single operation.

7. The method of claim 1, wherein the step of establishing is operative to establish non-printing dots as the non-printing image features, and wherein the non-printing dots are no larger in area than 2500 µm².

8. A method for preparing a halftone representation of an image for use in making a flexographic printing plate, the method comprising:
    identifying at least one printable image feature in the halftone representation to be used in making the flexographic plate according to at least one predetermined decision criterion; and
    establishing at least one non-printing image feature proximate to the printable image feature identified in the step of identifying, wherein the step of establishing is operative to establish one or more non-printing dots as the non-printing image feature.

9. A method for preparing a halftone representation of an image for use in making a flexographic printing plate, the method comprising:
    identifying at least one printable image feature in the halftone representation to be used in making the flexographic plate according to at least one predetermined decision criterion; wherein the step of identifying is operative to identify marginally printable image features that are too small to be reliably printed as the identified printable image features, and
    establishing at least one non-printing image feature proximate to the printable image feature identified in the step of identifying.

10. The method of claim 9, wherein the step of identifying comprises establishing a minimum size of image feature that is reliably printable as the at least one decision criterion.

11. The method of claim 10, wherein the step of identifying comprises locating in the halftone representation, image features that are smaller than the minimum size.

12. The method of claim 10, wherein the step of identifying comprises locating in the image, image features that are smaller than the minimum size.

13. The method of claim 10, wherein the image feature is a dot and the minimum site corresponds to a minimum reliably printable dot area.

14. The method of claim 10, wherein the image feature is a line and the minimum size corresponds to a minimum reliably printable line thickness.

15. A method for preparing a halftone representation of an image for use in making a flexographic printing plate, the method comprising:
    screening a continuous tone image to create the halftone representation;
    identifying at least one printable image feature in the halftone representation to be used in making the flexographic plate according to at least one predetermined decision criterion; and
    establishing at least one non-printing image feature proximate to the printable image feature identified in the step of identifying, wherein the step of establishing at least one non-printing image feature comprises adding a non-printing dot to the halftone representation.

16. A method for preparing a halftone representation of an image for use in making a flexographic printing plate, the method comprising:
    identifying at least one printable image feature in the halftone representation to be used in making the flexographic plate according to at least one predetermined decision criterion;
    establishing at least one non-printing image feature proximate to the printable image feature identified in the step of identifying; and
    removing sub-marginally printable image features from the halftone image representation.

17. A method for preparing a flexographic printing plate, the method comprising:
    establishing a relief floor by back-exposing the flexographic printing plate;
    receiving halftone image data representing an image to be printed, the halftone image data defining a plurality of printable image features, at least one non-printing feature disposed proximate to a marginally printable image feature, and at least one non-printing background area wherein the at least one non-printing feature is designed to raise the relief floor to a substantially uniform height proximate to the marginally printable image feature in order to improve the printability of the marginally printable image feature;
    exposing the flexographic printing plate in accordance with the halftone image data; and
    processing the flexographic printing plate to develop a relief image.

18. The method of claim 17, wherein the step of exposing the flexographic plate comprises:
    preparing a film mask in accordance with the halftone image data; and
    exposing the flexographic printing plate to image-forming radiation through the film mask.

19. A flexographic printing plate, comprising:
a background area corresponding to areas of an image to be printed having no printable image features;
an ink-transferring surface defined in relief to the background area and formed in accordance with the image to be printed, the ink-transferring surface having a plurality of printable image features, and
at least one non ink-transferring raised portion of the background area of substantially uniform height disposed proximate to a marginally printable image feature to improve the printability of the marginally printable image feature.

* * * * *